US009353017B2

(12) United States Patent
Krishna et al.

(10) Patent No.: US 9,353,017 B2
(45) Date of Patent: May 31, 2016

(54) METHOD OF TRIMMING CURRENT SOURCE USING ON-CHIP ADC

(71) Applicants: Siddhartha Gopal Krishna, New Delhi (IN); Vikram Varma, Noida (IN)

(72) Inventors: Siddhartha Gopal Krishna, New Delhi (IN); Vikram Varma, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 142 days.

(21) Appl. No.: 14/307,472

(22) Filed: Jun. 17, 2014

(65) Prior Publication Data
US 2015/0362942 A1 Dec. 17, 2015

(51) Int. Cl.
H03L 5/00 (2006.01)
C05F 3/02 (2006.01)
H03M 1/12 (2006.01)

(52) U.S. Cl.
CPC ... *C05F 3/02* (2013.01); *H03M 1/12* (2013.01)

(58) Field of Classification Search
CPC .................................. G05F 3/02; H03M 1/12
USPC .......................................................... 327/306
See application file for complete search history.

(56) References Cited

U.S. PATENT DOCUMENTS

| | | | |
|---|---|---|---|
| 5,410,366 A * | 4/1995 | Hostetler | H04N 5/18 348/691 |
| 5,717,321 A * | 2/1998 | Kerth | G06F 3/045 323/283 |
| 6,331,830 B1 | 12/2001 | Song | |
| 7,433,790 B2 | 10/2008 | Anderson et al. | |
| 7,482,859 B2 | 1/2009 | Wang et al. | |
| 7,541,953 B2 | 6/2009 | Chen | |
| 7,728,577 B2 | 6/2010 | Yu et al. | |
| 8,094,135 B2 * | 1/2012 | Chen | G06F 3/045 345/156 |
| 2005/0068076 A1 * | 3/2005 | Iroaga | G05F 3/262 327/158 |
| 2008/0061217 A1 * | 3/2008 | Burkatovsky | H03F 3/08 250/214 A |
| 2009/0039869 A1 * | 2/2009 | Williams | G01R 19/0092 324/123 R |
| 2009/0190384 A1 * | 7/2009 | Thompson | H02M 3/158 363/125 |
| 2010/0102832 A1 * | 4/2010 | Bartling | G06F 1/3215 324/679 |
| 2011/0298642 A1 | 12/2011 | Nomasaki et al. | |
| 2012/0013495 A1 * | 1/2012 | Rey-Losada | G01R 19/257 341/139 |
| 2012/0299630 A1 | 11/2012 | Sakurai et al. | |
| 2013/0107621 A1 | 5/2013 | He et al. | |
| 2013/0214946 A1 | 8/2013 | Verbruggen et al. | |
| 2013/0288614 A1 * | 10/2013 | Wu | H04B 17/13 455/73 |
| 2014/0145701 A1 * | 5/2014 | Temkine | G05F 3/30 323/314 |
| 2014/0253071 A1 * | 9/2014 | Hammerschmidt | G05F 1/10 323/280 |

* cited by examiner

Primary Examiner — Ryan Jager
(74) Attorney, Agent, or Firm — Charles E. Bergere

(57) ABSTRACT

A method of trimming a current source in an IC includes deriving a reference voltage from an external supply, and developing a measurement voltage across an external reference resistance receiving the current to be trimmed. An on-chip ADC is used to provide corresponding digital reference and digital measurement signals. A digital comparator compares the digital signals and provides a digital trim signal, which is used to adjust the current to be trimmed until the digital measurement signal is equal to the digital reference signal within an acceptable tolerance. Gain and offset errors in the ADC cancel and do not affect the calibration of the trim operation.

19 Claims, 3 Drawing Sheets

METHOD OF TRIMMING CURRENT SOURCE USING ON-CHIP ADC

BACKGROUND OF THE INVENTION

The present invention is directed to integrated circuits having current sources and, more particularly, to a method of trimming a current source using an on-chip analog-to-digital converter (ADC).

An integrated circuit (IC) often requires precise sources of current for various purpose, such as bias circuits for high performance circuits such as amplifiers, ADCs, phase-locked loop circuits (PLLs) and power management circuits. The process and voltage dispersions inherent in manufacturing ICs may necessitate trimming (permanent adjustment) of the current from the source to a desired value before delivery of the product. Current source trimming can be performed on a tester, such as automatic test equipment (ATE).

If the measurement and trimming are performed by the tester, the test time is prolonged and the tester needs a precision measurement instrument for voltage or current, which adds to test cost. Moreover, external equipment such as a tester performing measurement and trimming requires several pins on the IC, which then may not be usable in normal operation of the IC, increasing unnecessarily the pin count.

An IC often has an ADC on-chip (incorporated in the IC) for various purposes in normal operation of the IC. For example, in a sensor application-specific IC (ASIC), the ADC may be used to digitize an analog signal from a sensor or, in a general purpose microcontroller IC, the ADC may be used for digital control of a motor drive. The on-chip ADC can be used with other elements of the IC to perform self-trimming of the current source by the IC under control of the tester with reduced test time and without requiring a precision measurement instrument for voltage or current. However, on-chip ADCs have gain and offset errors that can affect the measurement and hence the trimming accuracy.

It would be advantageous to have a method of accurately trimming a current source using an imprecise on-chip ADC.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
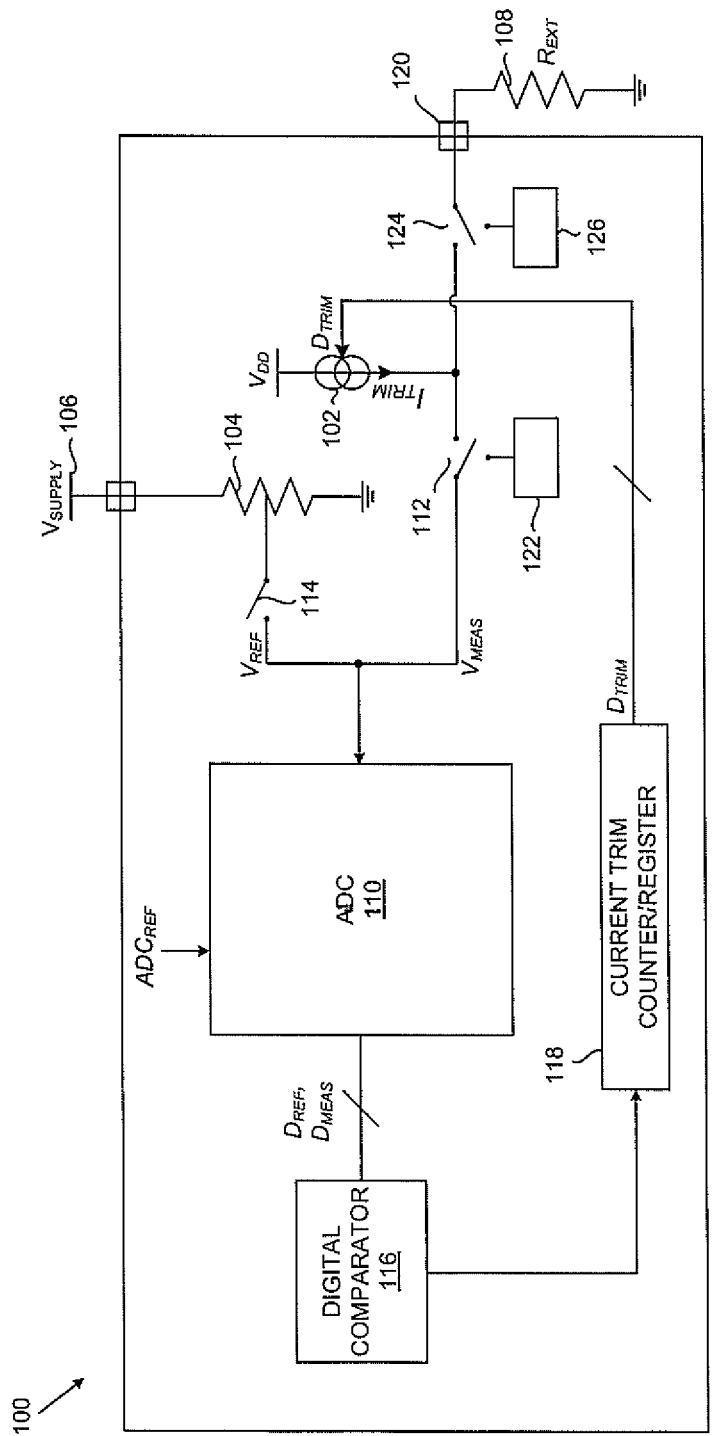
FIG. 1 is a schematic block diagram of an IC connected to a tester for trimming a current source of the IC in accordance with an embodiment of the invention.

Referring now to FIG. 1, an example of an integrated circuit (IC) 100 having a current source 102 whose current $I_{TRIM}$ can be trimmed by a method in accordance with an embodiment of the invention is shown. Currents copied from the current source 102 may be used in normal operation of the IC 100 to bias circuits that require precise currents. The IC 100 includes a reference voltage source 104 for providing a reference voltage $V_{REF}$ derived from an external voltage $V_{SUPPLY}$ provided by a tester (not shown) during a trim operation. In the embodiment shown, the voltage source 104 is a voltage divider. The current source 102 is connected to a reference resistor 108 of resistance $R_{EXT}$, located on a test board of the tester, during the trim operation.

The IC 100 also includes an on-chip analog to digital converter (ADC) 110 that may be used for various purposes in normal operation of the IC 100 and is used in the trimming operation as will be described below. The ADC 110 can be of any suitable architecture, such as successive approximation register (SAR), pipeline ADC (sub-ranging quantizer), or cyclic, for example. The ADC 110 does not need to be especially precise for the purpose of trimming the current source 102.

During the trimming operation, the ADC 110 receives inputs alternately of a measurement voltage $V_{MEAS}$ across the reference resistor 108 produced by the current $I_{TRIM}$ from the current source 102 through a first switch 112, and the reference voltage $V_{REF}$ from the source 104 through a second switch 114. Corresponding digital output signals $D_{MEAS}$ and $D_{REF}$ of the ADC 110 are input to a digital comparator 116, which compares the digital signals $D_{MEAS}$ and $D_{REF}$ and generates a digital trim signal $D_{TRIM}$ corresponding to the relative values of the digital signals to a counter or register 118. The digital trim signal $D_{TRIM}$ then is provided to the current source 102 to adjust the current $I_{TRIM}$.

Trimming current $I_{TRIM}$ from the current source 102 in the IC 100 in accordance with an embodiment of the present invention comprises providing the reference voltage $V_{REF}$, and connecting the reference resistance $R_{EXT}$ to receive the current $I_{TRIM}$ from the current source 102 and provide the corresponding measurement voltage $V_{MEAS}$. The on-chip ADC 110 is used to convert the reference voltage $V_{REF}$ and the measurement voltage $V_{MEAS}$ into corresponding digital reference signal $D_{REF}$ and digital measurement signal $D_{MEAS}$ respectively. The digital comparator 116 is used to compare the digital reference signal $D_{REF}$ and the digital measurement signal $D_{MEAS}$ and provide the digital trim signal $D_{TRIM}$. The digital trim signal $D_{TRIM}$ adjusts the current $I_{TRIM}$ from the current source 102 until the digital measurement signal $D_{MEAS}$ is equal to the digital reference signal $D_{REF}$, within an acceptable tolerance. The margin of error of the adjustment can be chosen as a function of the trimming accuracy of the current.

In this example, the reference resistance $R_{EXT}$ is external to the IC 100 and is provided on a test board of the tester, as is a supply voltage 106 of the external voltage $V_{SUPPLY}$ for the reference voltage $V_{REF}$. This facilitates ensuring accurate values of the resistance $R_{EXT}$ and of the external voltage $V_{SUPPLY}$. The tester controls the IC 100 to start and stop the sequence of steps of providing the digital reference signal $D_{REF}$ and the digital measurement signal $D_{MEAS}$ and adjusting the current $I_{TRIM}$ from the current source 102. One pin 120 is needed for the trimming process, with the pin 120 being connected to the reference resistance $R_{EXT}$. The external supply voltage $V_{SUPPLY}$ can be supplied through a power supply pin of the IC 100. Accordingly, just one pin is needed specifically for the trimming operation, and even that pin may be re-used in normal operation of the IC 100 in certain cases.

The first switch 112 may be a change-over switch connecting the current source 102 to the ADC 110 during the trimming operation, and connecting the ADC 110 to another block 122 of the IC 100 during normal operation. The pin 120 may be connected through a change-over switch 124 to the first switch 112 and then to the ADC 110 during the trimming mode of operation, and the change-over switch 124 can connect the pin 120 to another block 126 of the IC 100 to re-use the pin 120 during normal operation. The current source 102 may include a current mirror 202 (FIG. 2) for supplying to another element or elements 218 of the IC 100 during normal operation a current that is proportional to the current $I_{TRIM}$ that is supplied during the trimming operation to the reference resistance 108 $R_{EXT}$.

The current source 102 may include current mirror elements 204 (FIG. 2) connected in parallel with each other and controlled by the digital trim signal $D_{TRIM}$ to control an internal trim current $I_{TRIM\_INT}$ that adjusts the output current $I_{TRIM}$ from the current source 102. The current mirror elements 204 may provide different sub-multiples of a reference current $I_{REF}$ from a reference current source 210. The current mirror elements 204 may be connected individually in series with switch elements 206 that the digital trim signal $D_{TRIM}$ controls to connect the current mirror elements 204 in or out of circuit and adjust the current $I_{TRIM}$ from the current source 102.

The output of the digital comparator 116 may be a serial bit stream corresponding to relative values of the digital reference signal $D_{REF}$ and the digital measurement signal $D_{MEAS}$, and that is cumulated in the counter 118 to provide the digital trim signal $D_{TRIM}$ and adjust the current $I_{TRIM}$ from the current source 102. In this example, the comparator 116 performs iterative comparisons of the relative values of the digital reference signal $D_{REF}$ and the digital measurement signal $D_{MEAS}$ and provides successive bits of the bit stream that increment the digital trim signal $D_{TRIM}$ in the counter 118 according to the iterative comparisons.

In another example, the output of the comparator 116 is a parallel digital code signal corresponding to relative values of the digital reference signal $D_{REF}$ and the digital measurement signal $D_{MEAS}$. The digital trim signal $D_{TRIM}$ is stored in the register 118. Successive outputs of the comparator 116 update the stored digital trim signal $D_{TRIM}$ to adjust the current $I_{TRIM}$ from the current source 102. In each example, the digital trim signal $D_{TRIM}$ stored in the counter or register 118 is used during normal operation of the IC 100 to maintain the trimmed value of the current $I_{TRIM}$.

The on-chip ADC 110 does not need to provide an accurate analog to digital conversion provided it is stable during the trimming operation. The main typical errors in an ADC may be summarized as an offset error $D_{OFF}$ and a gain error G in the actual digital output signal of the ADC for a given analog input compared to the ideal value of the digital output signal. If the full range of the digital output signal of the ADC 110 has N binary digits and corresponds to an ADC reference voltage of $ADC_{REF}$, its digital output signal $D_{REF}$ corresponding to the input reference voltage $V_{REF}$ can be expressed as:

$$D_{REF} = G*2^N*V_{REF}/ADC_{REF} + D_{OFF}$$

Similarly, the digital output signal $D_{MEAS}$ corresponding to the measurement voltage $V_{MEAS}$ can be expressed as:

$$D_{MEAS} = G*2^N*V_{MEAS}/ADC_{REF} + D_{OFF}$$
$$= G*2^N*I_{TRIM}*R_{EXT}*D_{TRIM}/ADC_{REF} + D_{OFF}$$

Since the digital trim signal $D_{TRIM}$ adjusts the current $I_{TRIM}$ from the current source 102 until the digital measurement signal $D_{MEAS}$ is equal to the digital reference signal $D_{REF}$, within an acceptable tolerance, it follows that:

$$D_{REF} = D_{MEAS}, \text{ and}$$

$$G*2^N*V_{REF}/ADC_{REF} + D_{OFF} = G*2^N*I_{TRIM}*R_{EXT}*D_{TRIM}/ADC_{REF} + D_{OFF}$$

The offset errors $D_{OFF}$ cancel out and do not affect this equation. Similarly, the gain error G and any error in the ADC reference voltage $ADC_{REF}$ enter as factors $G*2^N/ADC_{REF}$ that also cancel out, leaving:

$V_{REF} = I_{TRIM}*R_{EXT}*D_{TRIM}$, which can be re-arranged to leave:

$$D_{TRIM} = V_{REF}/(I_{TRIM}*R_{EXT}).$$

Accordingly, the offset errors $D_{OFF}$, the gain error G and any error in the ADC voltage supply of $ADC_{REF}$ do not affect the calibration of the trim, whether the digital trim signal $D_{TRIM}$ is a difference signal that adds and subtracts corrections of the current $I_{TRIM}$, or a signal that multiplies the current $I_{TRIM}$ as a correction factor.

Figure 2:
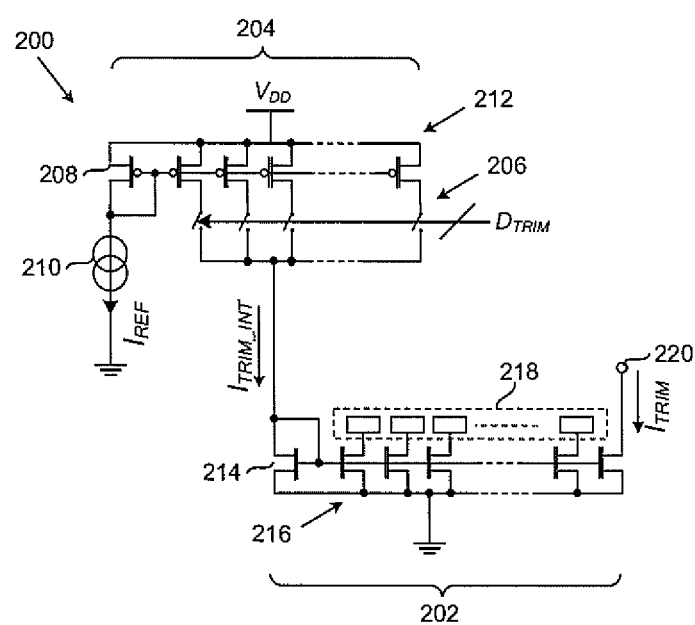
FIG. 2 is a simplified schematic circuit diagram of the current source of the IC of FIG. 1.

FIG. 2 illustrates an example 200 of the current source 102 including p-type and n-type metal-oxide-semiconductor (PMOS and NMOS) transistors. The current mirror elements 204 includes a PMOS transistor 208 whose current path receives the current $I_{REF}$ produced by the reference current source 210 and whose gate, connected to its own drain and to the current source 210, is also connected to the gates of a slave PMOS transistor 212. The slave transistor 212 has parallel-connected current paths. Each of the current paths of the slave transistor 212 is connected individually in series with a respective one of the switch elements 206 controlled by different digits of the digital trim signal $D_{TRIM}$. The parallel-connected current paths of the slave transistor 212 are connected to provide the internal trimmed current $I_{TRIM\_INT}$. The parallel connected paths may be equal or may be binary-weighted.

The current mirror 202 includes a master NMOS transistor 214 that receives the internal trimmed current $I_{TRIM\_INT}$ and whose gate, which is connected to its own drain and to the current mirror 204, is also connected to the gates of slave NMOS transistors 216. The current paths of the slave NMOS transistors 216 are connected to supply individually respective currents proportional to the internal trimmed current $I_{TRIM\_INT}$ to the various other elements 218 of the IC 100. One of the slave NMOS transistors 216 is connected to supply to a node 220 connected to the cross-over switch 124 the output current $I_{TRIM}$ that is observed during the trimming operation and that is also proportional to the internal trimmed current $I_{TRIM\_INT}$. Although the architecture shown in FIG. 2 has source current being pulled from a PMOS transistor and then mirrored and dumped to an NMOS transistor, it will be appreciated that the inverse architecture can be used.

Figure 3:
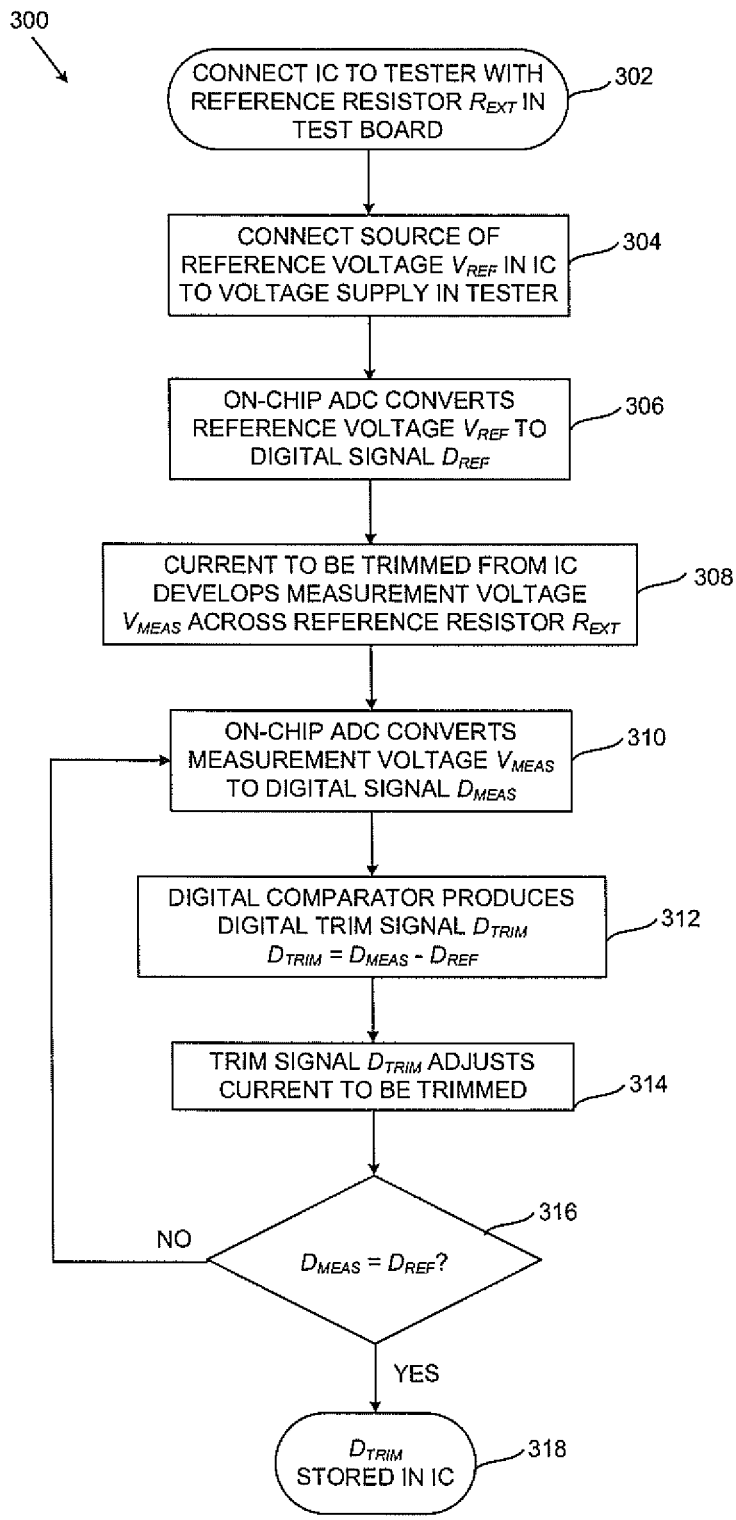
FIG. 3 is a flow chart of a method of trimming a current source of an IC in accordance with an embodiment of the invention.

FIG. 3 is a flow chart of an example of a process flow for performing a method 300 of trimming current $I_{TRIM}$ from the current source 102 in accordance with an embodiment of the invention. At 302, the IC 100 is connected to a tester having a reference resistance $R_{EXT}$. The reference voltage source 104 of the IC 100 is connected to a calibrated voltage supply 106 of the tester at 304 to provide the reference voltage $V_{REF}$. The counter/register 118 is initialized by being reset to zero. The on-chip ADC 110 converts the reference voltage $V_{REF}$ to a digital signal $D_{REF}$ at 306. At 308, the current source 102 is connected to supply current $I_{TRIM}$ to the reference resistance $R_{EXT}$ 108 and develop a corresponding measurement voltage $V_{MEAS}$. The on-chip ADC 110 converts the measurement voltage $V_{MEAS}$ to a digital signal $D_{MEAS}$ at 310. At 312, the digital comparator 116 provides the digital trim signal $D_{TRIM}$ quantifying the relative values of the digital reference signal $D_{REF}$ and the digital measurement signal $D_{MEAS}$. At 314, the digital trim signal $D_{TRIM}$ adjusts the current $I_{TRIM}$ to be trimmed. At 316 a decision is taken whether the digital reference signal $D_{REF}$ is equal to the digital measurement signal $D_{MEAS}$ within an acceptable tolerance. If not, the process reverts to step 310 and repeats steps 310 to 316. If the digital reference signal $D_{REF}$ is equal to the digital measurement signal $D_{MEAS}$ at 316, the trimming operation is terminated and the digital trim signal $D_{TRIM}$ is stored in the IC 100 at 318 for use during normal operation of the IC 100.

The invention may be implemented partially in software instructions running on the IC 100 (and the tester).

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit (IC), comprising:
a current source that is trimmed in a trimming mode of operation in which the current source is connected to pass a current through a reference resistance of a test board of a tester and provide a corresponding measurement voltage;
a reference voltage source for providing a reference voltage that is derived from a supply voltage of the tester;
an on-chip analog-to-digital converter (ADC) for converting the reference voltage and the measurement voltage to a corresponding digital reference signal and a digital measurement signal respectively;
a digital comparator for comparing the digital reference signal and the digital measurement signal, and providing a digital trim signal used to adjust the current from the current source until the digital measurement signal is equal to the digital reference signal, within an acceptable tolerance; and
a change-over switch connected to a pin of the IC, wherein the reference resistance is external to the IC and connected to the IC through the pin, wherein the change-over switch connects the pin to the on-chip ADC during the trimming mode, and connects the pin to another block of the IC during normal operation of the IC.

2. The IC of claim 1, wherein the current source includes a current mirror for supplying to another element or elements of the IC a current that is proportional to the current that is supplied to the reference resistance.

3. The IC of claim 1, wherein the current source includes current mirror elements connected in parallel with each other and controlled by the digital trim signal to adjust the current from the current source.

4. The IC of claim 3, wherein the current mirror elements provide different sub-multiples of current from a reference current source, the current mirror elements being connected individually in series with switch elements controlled by the digital trim signal, to connect the current mirror elements in or out of the circuit and adjust the current from the current source.

5. The IC of claim 1, further comprising a counter, wherein the output of the digital comparator is a serial bit stream corresponding to relative values of the digital reference signal and the digital measurement signal, and wherein said serial bit stream is accumulated in the counter to provide the digital trim signal and adjust the current from the current source.

6. The IC of claim 5, wherein the digital comparator performs iterative comparisons of the relative values of the digital reference signal and the digital measurement signal and provides successive bits of the bit stream that increment the digital trim signal in the counter according to the iterative comparisons.

7. The IC of claim 1, wherein the output of the digital comparator is a parallel digital code signal corresponding to relative values of the digital reference signal and the digital measurement signal, the digital trim signal is stored in a register, and successive outputs of the digital comparator update the stored digital trim signal to adjust the current from the current source.

8. A method of trimming current from a current source in an integrated circuit (IC), the method comprising:
providing a reference voltage derived from a supply voltage;
connecting a reference resistance to the current source to receive the current from the current source and provide a corresponding measurement voltage;
using an on-chip analog-to-digital converter (ADC) of the IC to convert the reference voltage and the measurement voltage and provide a corresponding digital reference signal and digital measurement signal respectively;
using a digital comparator to compare the digital reference signal and the digital measurement signal and provide a digital trim signal that adjusts the current from the current source until the digital measurement signal is equal to the digital reference signal within an acceptable tolerance, wherein the reference resistance is external to the IC and connected to the IC through a pin thereof; and
using a change-over switch to connect the pin to the on-chip ADC during a trimming mode of the IC, and to connect the pin to another block of the IC during normal operation of the IC.

9. The method of claim 8, wherein a tester with a test board provides the supply voltage for the reference voltage, and the reference resistance, and controls the IC to start and stop the sequence of steps of using the on-chip ADC, using the digital comparator, and adjusting the current from the current source.

10. The method of claim 8, wherein the current source includes a current mirror for supplying to another element or elements of the IC a current that is proportional to the current that is supplied to the reference resistance.

11. The method of claim 8, wherein the current source includes current mirror elements connected in parallel with each other and controlled by the digital trim signal to adjust the current from the current source.

12. The method of claim 11, wherein the current mirror elements provide different sub-multiples of current from a reference current source, the current mirror elements being connected individually in series with switch elements that the digital trim signal controls to connect the current mirror elements in or out of circuit and adjust the current from the current source.

13. The method of claim 8, wherein the output of the digital comparator is a serial bit stream corresponding to relative values of the digital reference signal and the digital measurement signal, and that is cumulated in a counter in the IC to provide the digital trim signal and adjust the current from the current source.

14. The method of claim 8, wherein the digital comparator performs iterative comparisons of the relative values of the digital reference signal and the digital measurement signal and provides successive bits of the bit stream that increment the digital trim signal in the counter according to the iterative comparisons.

15. The method of claim 8, wherein the output of the digital comparator is a parallel digital code signal corresponding to relative values of the digital reference signal and the digital measurement signal, the digital trim signal is stored in a register in the IC, and successive outputs of the digital comparator update the stored digital trim signal to adjust the current from the current source.

16. A method of trimming current from a current source in an integrated circuit (IC) using a tester having a test board including a voltage supply and a reference resistance, and wherein the IC includes a reference voltage source, an on-chip analog-to-digital converter (ADC) and a digital comparator, the method comprising:
deriving a reference voltage from a voltage supply of the tester to the IC;
connecting the reference resistance of the tester board to receive the current from the current source and provide a corresponding measurement voltage;
the ADC providing a digital reference signal and a digital measurement signal corresponding respectively to the reference voltage and to the measurement voltage;
the digital comparator comparing the digital reference signal and the digital measurement signal and providing a digital trim signal that adjusts the current from the current source until the digital measurement signal is equal to the digital reference signal within an acceptable tolerance, wherein the reference resistance is external to the IC and connected to the IC through a pin thereof; and
using a change-over switch to connect the pin to the on-chip ADC during a trimming mode of the IC, and to connect the pin to another block of the IC during normal operation of the IC.

17. The method of claim 16, wherein the tester controls the IC to start and stop the sequence of steps of providing the digital reference signal and the digital measurement signal and adjusting the current from the current source.

18. The method of claim 16, wherein the output of the digital comparator is a serial bit stream corresponding to relative values of the digital reference signal and the digital measurement signal, and that is cumulated in a counter in the IC to provide the digital trim signal and adjust the current from the current source.

19. The method of claim 18, wherein the digital comparator performs iterative comparisons of the relative values of the digital reference signal and the digital measurement signal and provides successive bits of the bit stream that increment the digital trim signal in the counter according to the iterative comparisons.

* * * * *